United States Patent
Chen et al.

(10) Patent No.: US 7,038,230 B2
(45) Date of Patent: May 2, 2006

(54) HORIZONTAL CHALCOGENIDE ELEMENT DEFINED BY A PAD FOR USE IN SOLID-STATE MEMORIES

(75) Inventors: Yi-Chou Chen, Hsinchu (TW); Hsiang-Lan Lung, Hsinchu (TW); Ruichen Liu, Hsinchu (TW)

(73) Assignee: Macronix Internation Co., Ltd., Hsinchu (TW)

( * ) Notice: Subject to any disclaimer, the term of this patent is extended or adjusted under 35 U.S.C. 154(b) by 15 days.

(21) Appl. No.: 10/752,422

(22) Filed: Jan. 6, 2004

(65) Prior Publication Data

US 2005/0145984 A1    Jul. 7, 2005

(51) Int. Cl.
*H01L 47/00* (2006.01)

(52) U.S. Cl. .................. 257/3; 257/2; 257/4; 257/5; 257/40

(58) Field of Classification Search ........ 257/1–5, 257/40, 41

See application file for complete search history.

(56) References Cited

U.S. PATENT DOCUMENTS

| | | | |
|---|---|---|---|
| 6,031,287 A | 2/2000 | Harshfield | |
| 6,111,264 A | 8/2000 | Wolstenholme et al. | |
| 6,114,713 A | 9/2000 | Zahorik | |
| 6,147,395 A * | 11/2000 | Gilgen | 257/529 |
| 6,189,582 B1 | 2/2001 | Reinberg et al. | |
| 6,300,684 B1 * | 10/2001 | Gonzalez et al. | 257/774 |
| 6,462,353 B1 * | 10/2002 | Gilgen | 257/3 |
| 6,750,079 B1 * | 6/2004 | Lowrey et al. | 438/95 |
| 6,797,978 B1 * | 9/2004 | Gonzalez et al. | 257/3 |
| 6,838,691 B1 * | 1/2005 | Liu et al. | 257/3 |
| 6,841,793 B1 * | 1/2005 | Lee | 257/3 |
| 6,900,517 B1 * | 5/2005 | Tanaka et al. | 257/532 |

\* cited by examiner

*Primary Examiner*—Andy Huynh
(74) *Attorney, Agent, or Firm*—Stout, Uxa, Buyan & Mullins, LLP (57) ABSTRACT

A process for fabricating phase-change elements having ultra small cross-sectional areas for use in phase change memory cells specifically and in semiconductor devices generally in which pads are implemented to create horizontally aligned phase change elements is disclosed. The elements thus defined may be used within chalcogenide memory cells or other semiconductor devices.

4 Claims, 10 Drawing Sheets

HORIZONTAL CHALCOGENIDE ELEMENT DEFINED BY A PAD FOR USE IN SOLID-STATE MEMORIES

BACKGROUND OF THE INVENTION

1. Field of the Invention

The present invention relates generally to semiconductor fabrication methods and, more particularly, to the fabrication of horizontal chalcogenide memory devices.

2. Description of Related Art

Electrically writable and erasable phase change materials have traditionally been used for memory devices. Chalcogenide materials can be electrically switched between two structural states of generally crystalline and generally amorphous local order. The generally crystalline state is a phase in which the material's atoms and/or electrons form a repeatable lattice structure, whereas the atoms and/or electrons of the generally amorphous state are randomly distributed. The structural state can also be switched among a range of detectable structural states of local order between the extremes of completely crystalline and completely amorphous states.

The currently favored chalcogenide materials that are used for phase change memory applications typically contain mixtures of Te, Se, Ge, Sb, Bi, Pb, Sn, As, S, Si, P, and/or O. Because of the range of structural states, a given as-deposited stoichiometric chalcogenide material can have varied bulk conductivities. Generally speaking, the more crystalline local order the state has, the higher the conductivity of the material. Moreover, the conductivity of the material can be selectively and repeatably established via an electrical pulse of given voltage and duration, herein called a setting or resetting voltage. The conductivity remains stable until another setting or resetting voltage of comparable size is applied. Furthermore, the conductivity of the material appears to vary inversely with the setting or resetting voltage and does not depend upon the previous state of the material, i.e., the material lacks hysteresis. The aforementioned materials can be used to store and retrieve information within a non-volatile, overwritable memory cell. When different setting or resetting voltages are employed to change the conductivity of the material, the corresponding conductivities can be distinguished by various means including, but not limited to, the application of a relatively smaller voltage across the material within the cell. If, for example, two distinct setting or resetting voltages are used, one memory cell is able to store and retrieve one bit of binary encoded data. If more than two distinct setting or resetting voltages are used, then one memory cell is able to store and retrieve an analog form that can represent multiple bits of binary encoded data. Since the chalcogenide materials are able to maintain their respective conductivities, the memory cells are non-volatile, in that no refreshes are necessary to keep the data stored. Because for example the same materials lack hysteresis, the memory cells can be directly overwritten, in that no data erasures are necessary prior to storing new data within the cells.

It is known that chalcogenide phase change memory is not easy to incorporate into a CMOS circuit because the chalcogenide material requires a relatively high current to change its state. Reducing the cross-sectional area of the chalcogenide part can reduce the current requirement in direct proportion. Structures which have been developed and which reduce this cross-sectional area involve fabricating ultra small contacts and depositing the chalcogenide into the contacts. One of the methods of fabricating ultra small contacts involves using a dielectric film to further reduce the photolithographic limit as referenced in U.S. Pat. No. 6,111,264. The cross-sectional area can be reduced, but the shrinking ratio is limited by the spacer thickness. For example, if the pore diameter is 1600 Å and the spacer thickness is 400 Å, the shrinkage ratio is only about 50%. The minimum pore diameter is determined by the photolithography and the spacer thickness shrinkage ratio can be limited. Thus, it can be difficult to scale down the chalcogenide parts in this fashion. If the chalcogenide parts cannot be scaled down, the current must be high for them to change their states.

There can be additional problems once the pores are scaled down. For instance, the uniformity of the pore-to-pore diameters can be poor. Moreover, the small pores can place constraints on the chalcogenide deposition process since it will be more difficult to deposit materials into the tiny openings. For example, in the context of pores formed using the process of the preceding paragraph, overhang of the spacer may partially or fully occlude the pore, further compromising the reliability of the deposition procedure. Additionally, if the bottoms of the pores receive poor bottom coverage, the electrodes beneath them would not be able to predictably change the phases of the chalcogenide parts. If the phases are not repeatable when a given current is applied, the memory cell cannot reliably store data.

A need thus exists in the prior art for a robust process to form chalcogenide parts with uniformly smaller cross-sectional areas. Smaller cross-sectional areas can decrease the power requirement for the device. A further need exists for these elements to have better contacts with the bottom electrodes.

SUMMARY OF THE INVENTION

The present invention discloses a chalcogenide element structure and two innovative methods in the formation of chalcogenide phase change memories. The cross-sectional areas of the chalcogenide elements produced by these methods are relatively small, resulting in dramatically decreased current/power requirements of the resulting chalcogenide memory devices.

In accordance with one aspect of the present invention, a method for fabricating chalcogenide elements comprises depositing a first layer onto a substrate that has its bottom electrodes exposed. The first layer comprises a dielectric material or polysilicon. The first layer is then pattern etched to form pads between the bottom electrodes. A second layer is then deposited on top of the bottom electrodes and against the sides of the pads. The second layer comprises a chalcogenide phase change material. The second layer is etched back to form chalcogenide strips of ultra small cross-sectional area. The pads and chalcogenide strips are then pattern etched to form the final horizontal chalcogenide elements that will ultimately store data in the memory cells. If the pads, which were formed from the first layer, comprise polysilicon, they are removed from the resulting structure.

Each horizontal chalcogenide element extends horizontally, relative to a surface of the substrate, and has an end that is adjacent to one of the bottom electrodes. A successive process flow forms top electrodes above the horizontal chalcogenide elements. Each of the top electrodes is adjacent to an end of one of the horizontal chalcogenide elements. Each of the chalcogenide elements thus extends horizontally from a bottom electrode to a top electrode, rather than vertically through a pore. In certain embodiments, the pads can remain as spacers between the chalcogenide elements.

In accordance with another aspect of the present invention, a method for fabricating chalcogenide element consists of depositing a first layer onto a substrate that has its bottom electrodes exposed. The first layer comprises a dielectric material or polysilicon. The first layer is then pattern etched to form pads between pairs of bottom electrodes. A second layer is then deposited on top of the bottom electrodes against the sides of the pads. The second layer comprises a chalcogenide phase change material. The second layer is etched back to form chalcogenide strips of ultra small cross-sectional area. The pads and chalcogenide strips are then pattern etched to form the final horizontal chalcogenide element that will ultimately store data in the memory cells. The pads can then be etched away completely. A successive process flow forms top electrodes above the horizontal chalcogenide elements.

There need not be etched pores in either method, thus removing photolithography as a limit to the cross-sectional areas of the chalcogenide elements. The problem of effectively depositing chalcogenide into ultra small pores is also eliminated. The chalcogenide element can be fabricated with relative ease since there is no need to place material into small pores.

In accordance with another aspect of the present invention, the cross-sectional area of each chalcogenide element is defined by the thickness of the first layer, the thickness of the second layer, and the etch back process on the second layer. With good control of the thickness for each of the two films, the cross-sectional area can be made relatively very small. The smaller area reduces the current required in the chalcogenide phase change memory. The cross-sectional area of the chalcogenide element is relatively easy to scale down since the scaling limit of thin film and etch back processes is less than 50 Å in 0.25-μm technology. For example, if the first layer thickness is 500 Å and the second layer thickness is 200 Å, which are relatively easy to fabricate by 0.25-μm processes, the cross-sectional area will be less than $10^5$ Å$^2$. This dimension corresponds to a contact pore with a diameter of 0.036 μm, which is cumbersome to nearly impossible to fabricate today using conventional methods. Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention have been described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Two methods of fabricating elements are presented that provide element cross-sectional areas which may be smaller than that presently provided using conventional and some modified photolithographic methods. In particular, the illustrated embodiments disclosed herein exemplify methods in accordance with the present invention of fabricating elements that rely upon pads to define minimum heights of the elements and rely upon thicknesses of element comprising films (disposed over the pads) to define minimum widths of the elements. In either manner, phase change elements having minimum heights of about 20 Å and minimum widths of about 20 Å can be obtained.

Reference will now be made in detail to the presently preferred embodiments of the invention, examples of which are illustrated in the accompanying drawings. Wherever possible the same or similar reference numbers are used in the drawings and the description to refer to the same or like parts. It should be noted that the drawings are in simplified form and are not to precise scale. In reference to the disclosure herein for purposes of convenience and clarity only, directional terms, such as top, bottom, left, right, up, down, over, above, below, beneath, rear, front, vertical, horizontal, length, width, and height are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of CMOS phase change memories. The present invention may be practiced in conjunction with various semiconductor fabrication techniques that are conventionally used in the art, and only so much of the commonly practiced process steps are included herein as are necessary to provide an understanding of the present invention. The present invention has applicability in the fabrication of horizontal elements in general. For illustrative purposes, however, the following description pertains to fabrication of horizontal chalcogenide elements for use in phase change memory devices.

Figure 1:
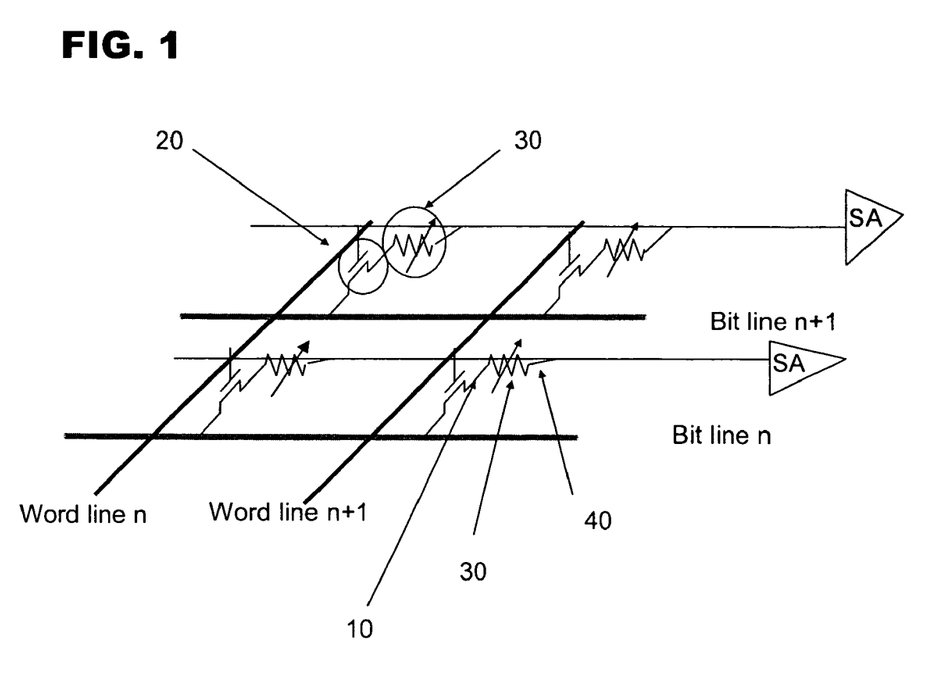
FIG. 1 is a schematic diagram of four memory cells in a CMOS chalcogenide memory device in accordance with first and second illustrated embodiments of the present invention.

FIG. 1 is an electronic schematic diagram depicting four memory cells from a chalcogenide phase change memory device. A portion of the memory cell that is relevant to the present invention starts with a bottom electrode 10 that is adjacent to a steering element 20. The bottom electrode 10, in turn, is adjacent to a phase change element 30. The phase change element 30 behaves like a variable resistor, in that it can have varied conductivities arising from its phase. The phase change element 30 is further disposed adjacent to a top electrode 40, with the resulting combination forming a memory cell.

Figure 2A:
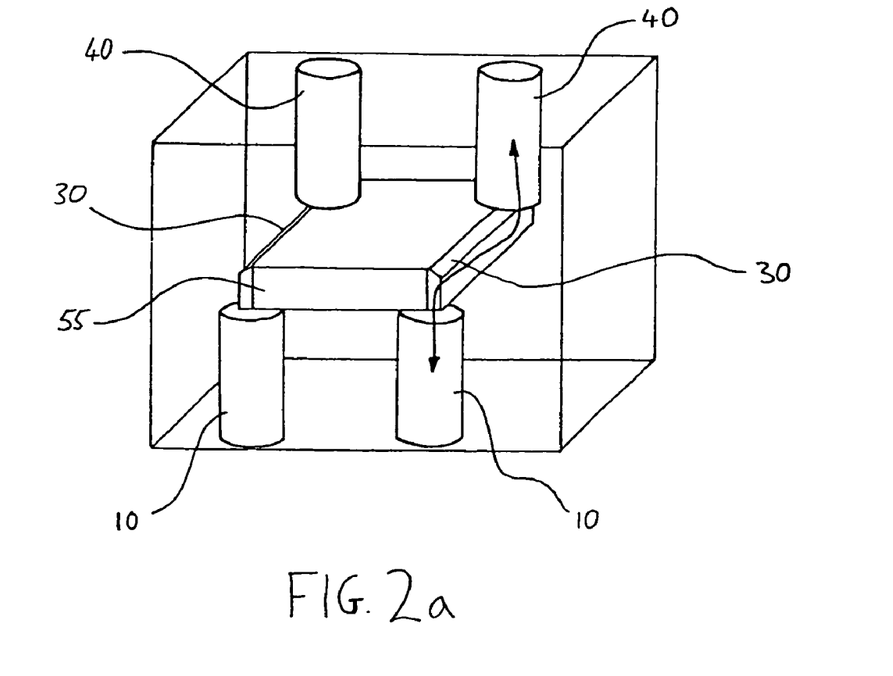
FIGS. 2a–2d are schematic diagrams of a semiconductor profile that results from following process steps in accordance with the first and second illustrated embodiments of the present invention.
Figure 2B:
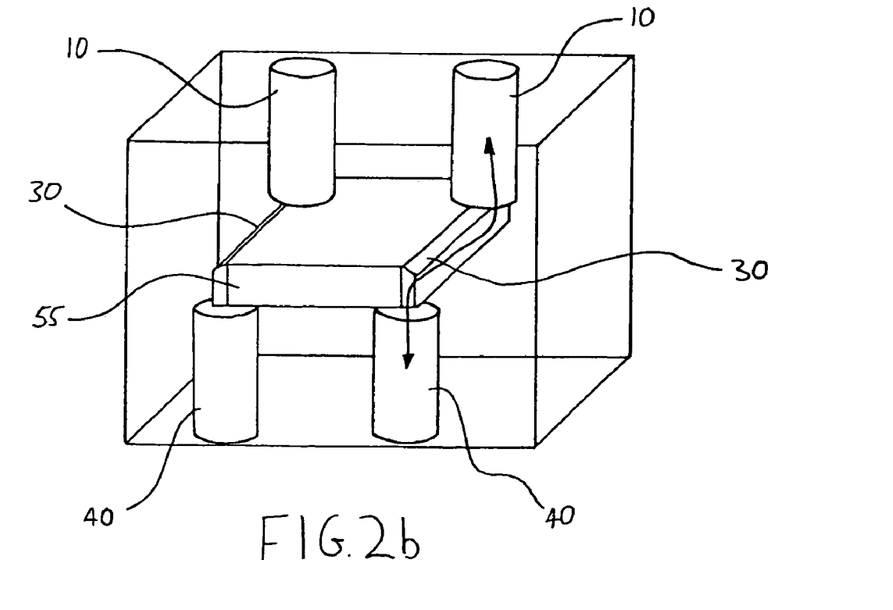
Figure 2C:
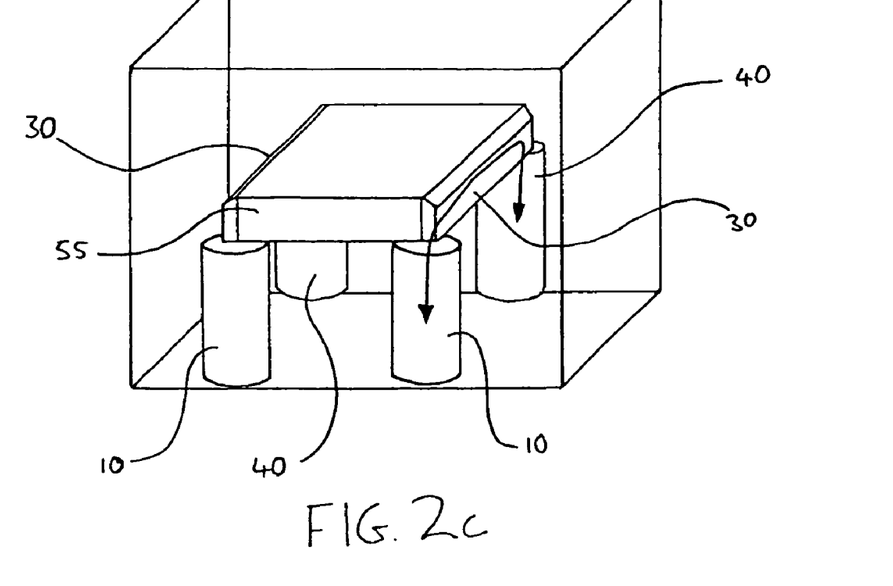
Figure 2D:
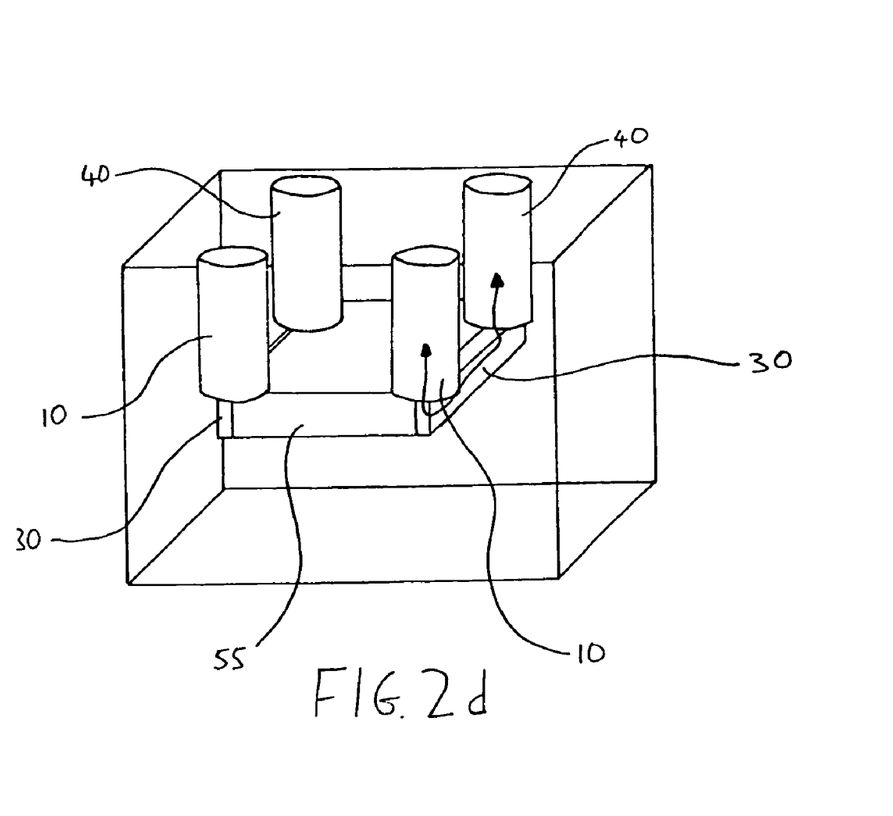
Figure 3:
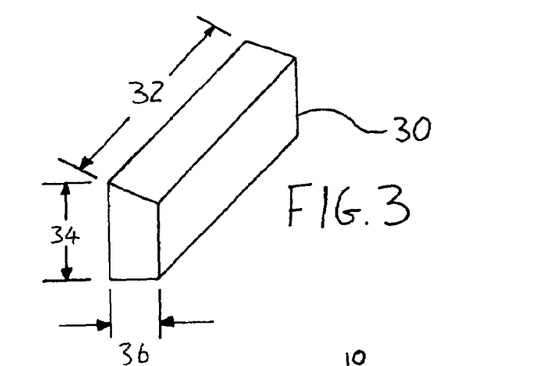
FIG. 3 is a schematic diagram of an isolated phase change element in accordance with the first and second illustrated embodiments of the present invention.

The three-dimensional schematic profile of FIGS. 2a–2d show two of the aforementioned memory cells as they would typically appear in semiconductor devices according to the present invention. In FIG. 2a, as previous nomenclature indicates, the bottom electrodes 10 are near the bottom of the diagram while the top electrodes 40 are near the top of the diagram. In FIG. 2b, however, the top electrodes 40 are near the bottom of the diagram and the bottom electrodes 10 are near the top. Moreover, in FIG. 2c, both the top electrodes 40 and the bottom electrodes 10 are disposed near the bottom of the diagram, while in FIG. 2d the top electrodes 40 and the bottom electrodes 10 are disposed near the top of the diagram The phase change elements 30 are oriented such that current flows horizontally through them. The horizontal orientation of these phase change elements 30 differs from conventional techniques of forming contacts or vias such that current flows vertically. While the phase change element 30 has its longest dimension parallel to a substrate 15 (FIG. 4a), the smallest dimensions of the phase change element 30 in accordance with an aspect of the present invention are oriented along its width 36 and height 34, as shown in FIG. 3. As used herein, the dimensions of width and length for the illustrated embodiments are oriented parallel to the substrate 15 while delineations of height are measured perpendicularly to the substrate 15.

Figure 6:
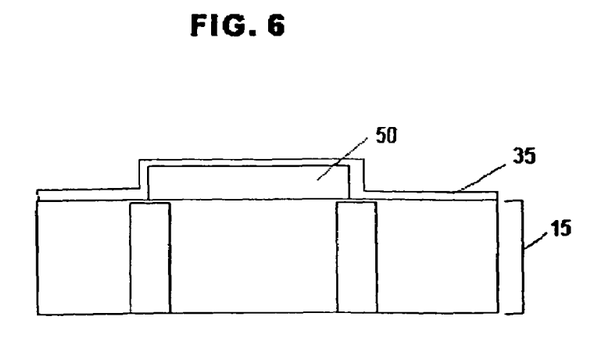
FIG. 6 is a schematic diagram of a semiconductor profile showing a phase change material layer that results from a third step of a semiconductor process in accordance with the first and second illustrated embodiments of the present invention.

The illustrated phase change elements 30 differ from common contacts and vias, which have width and length as their smallest dimensions. In accordance with an aspect of the present invention, a phase change layer 35 (FIG. 6), which defines a width 36 and a height 34 of the resulting phase change element 30, can be deposited with a minimum thickness of, for example, about 20 Å, while the above-described conventional pores can be etched via photolithography to have minimum widths of, for example, about 1800 Å. Thus the cross-sectional area of the phase change element 30 of the present invention can reach substantially smaller dimensions than those of the smallest pores formed by etching. The below embodiments of the present invention elucidate methods whereby phase change elements 30 of minimal cross-sectional areas are formed.

With reference to FIGS. 4a through 9c, a first illustrated embodiment of a method for fabricating phase change elements 30, such as chalcogenide materials, of ultra small cross-sectional area will now be described. A substrate 15 comprises, for example, silicon, silicon germanium, or gallium arsenide, prepared by standard means such as cleaning the wafer, creating a denuded zone along the wafer's surface, etc., and further comprises, for example, a layer of silicon dioxide or silicon nitride, with bottom electrodes 10 formed therein.

Figure 4A:
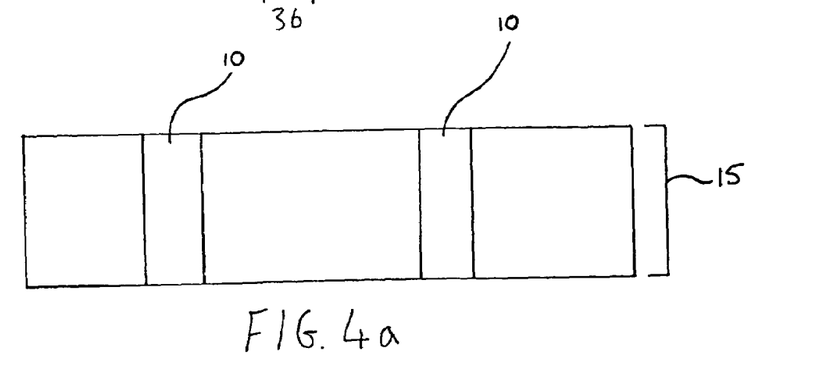
FIG. 4a is a schematic diagram of a semiconductor profile showing a cross-sectional view of a substrate including its bottom electrodes that result from a first step of a semiconductor process in accordance with the first and second illustrated embodiments of the present invention.
Figure 4B:
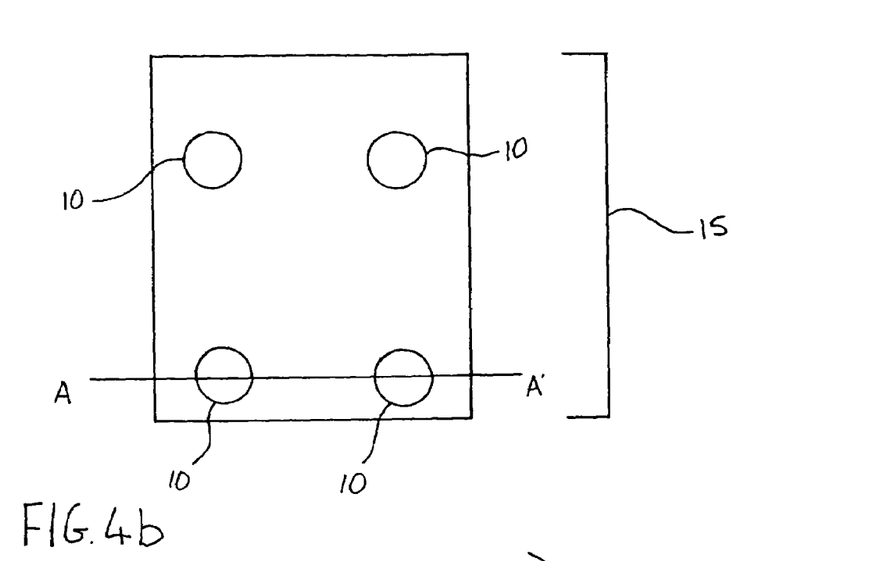
FIG. 4b is a schematic diagram of a semiconductor profile showing a plan view of a substrate including its bottom electrodes that result from the first step of a semiconductor process in accordance with the first and second illustrated embodiments of the present invention.

The bottom electrodes 10 are formed within the substrate 15 using, for example, any typical CMOS process, such as 0.18 μm W plug, as shown in FIGS. 4a and 4b. A first material layer is then deposited over the substrate 15. The first material layer can comprise silicon dioxide, silicon nitride, silicon oxynitride, or any other suitable dielectric material. These dielectric materials can be easily formed, for example, by silane-based chemical vapor deposition or by TEOS-based chemical vapor deposition since the substrate 15 is a planar surface, i.e., there are no topographical features to fill within the substrate 15. A preferred first material layer can comprise SiN with a thickness, i.e. height 34, of about 500 Å. The first material layer is then etched to form a pad strip 50 and as presently embodied to expose parts of the bottom electrodes 10. One such pad strip 50 can be viewed from the side in FIG. 5a and from the top in FIG. 5b. From the view of the pad strip 50 in FIG. 5b, it can be seen that the pad strip 50 is adjacent to the bottom electrodes 10. The etch can comprise a conventional photolithographic dielectric etch that is preferably selective to the pad strip 50 versus whichever dielectric material is present in the substrate 15. A conventional dry etch process can provide a SiN/SiO2 etching ratio at about 5:1.

Figure 7A:
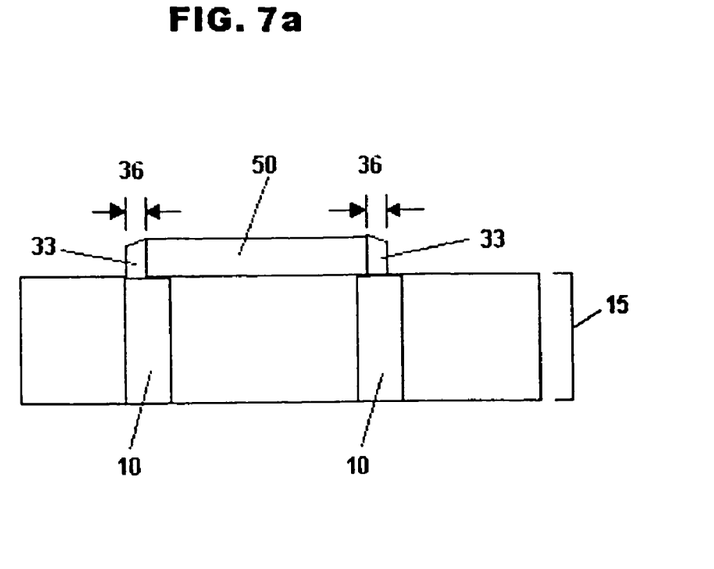
FIG. 7a is a schematic diagram of a semiconductor profile showing a cross-sectional view of phase change strips that remain after a fourth step of a semiconductor process in accordance with the first and second illustrated embodiments of the present invention.
Figure 7B:
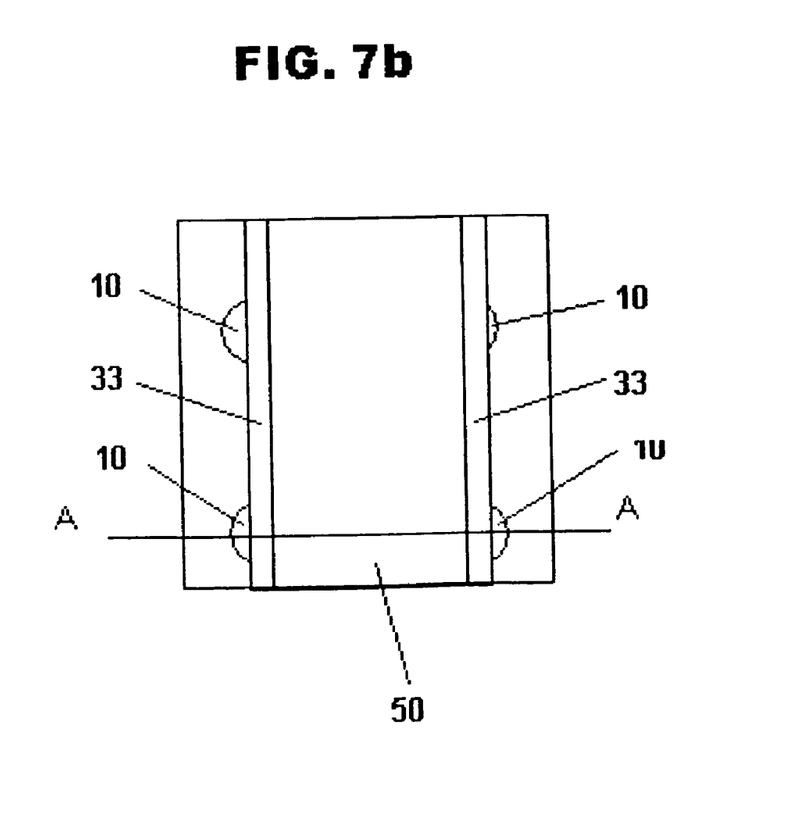
FIG. 7b is a schematic diagram of a semiconductor profile showing a plan view of phase change strips that remain after the fourth step of a semiconductor process in accordance with the first and second illustrated embodiments of the present invention.

Once the pad strip 50 is formed, the phase change layer 35 is deposited over the pad strip 50 and the substrate 15. In the illustrated embodiment, the phase change layer 35 comprises a chalcogenide material. An exemplary chalcogenide material may be formed over the pad strip 50 and substrate 15 by DC sputter or RF sputter. A preferred stoichiometry of the chalcogenide material is $Ge_2Sb_2Te_5$. As presently embodied, the chalcogenide material is deposited uniformly over the pad strip 50, over the substrate 15, and along the sides of the pad strip 50 as shown is FIG. 6. An etch back process can then be performed to modify the phase change layer 35 by removing a portion of the phase change layer 35 that is on top of the pad strip 50 and by removing another portion of the phase change layer 35 that is on top of the substrate 15, thus forming phase change strips 33 (FIG. 7a) adjacent to both the sides of the pad strip 50 and the bottom electrodes 10 as shown in FIGS. 7a and 7b. A preferred etch back process involves chlorine with an endpoint and overetch that is determined by optical or loading detector. In accordance with an aspect of the present invention, the thickness of the pad strip 50, and to a lesser extent the thickness of the phase change strips 33 and the etch back process, can affect the height 34 of the phase change element 30; whereas, sidewall coverage of the phase change layer 35 and the etch back process can affect the width 36 of the phase change element 30. Height 34 and width 36 dimensions of the phase change element 30 are illustrated, for example, in FIGS. 3, 5a, and 7a.

Figures 8A, 8B, 10:
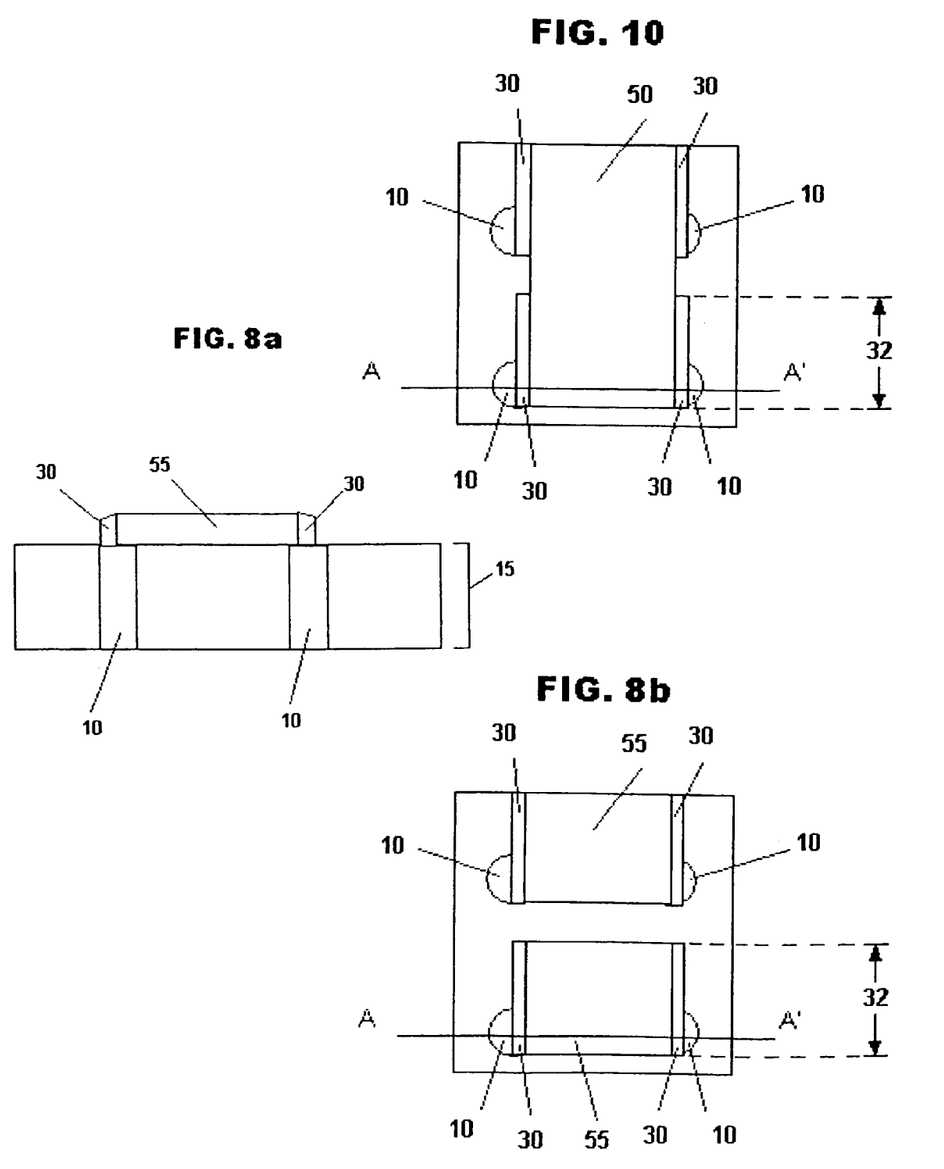
FIG. 8a is a schematic diagram of a semiconductor profile showing a cross-sectional view of phase change element that remain after a fifth step of a semiconductor process in accordance with the first illustrated embodiment of the present invention.
FIG. 8b is a schematic diagram of a semiconductor profile showing a plan view of phase change elements that remain after the fifth step of a semiconductor process in accordance with the first illustrated embodiment of the present invention.
FIG. 10 is the same schematic diagram of a semiconductor profile as FIG. 8b, showing a plan view of phase change elements that remain after the fifth step of a semiconductor process in accordance with the second illustrated embodiment of the present invention.
Figure 9A:
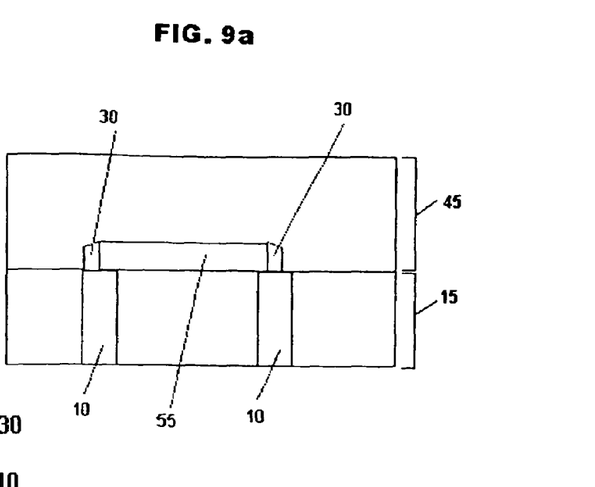
FIG. 9a is a schematic diagram of a semiconductor profile showing a first cross-sectional view of two memory cells including the bottom electrodes resulting from subsequent steps of a semiconductor process in accordance with the first illustrated embodiment of the present invention.
Figure 9B:
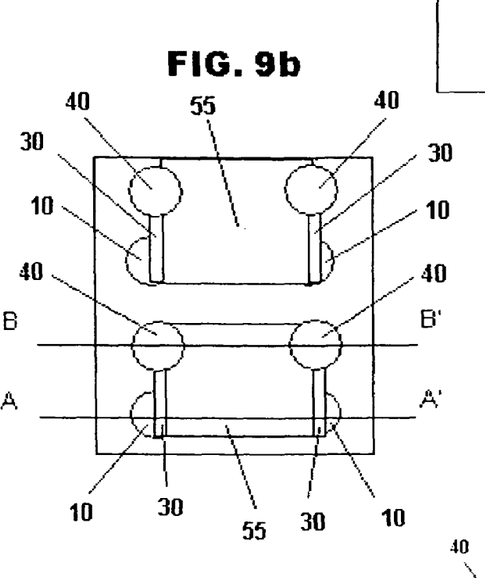
FIG. 9b is a schematic diagram of a semiconductor profile showing a plan view, with top oxide not shown for clarity, of two memory cells resulting from the subsequent steps of a semiconductor process in accordance with the first illustrated embodiment of the present invention.
Figure 9C:
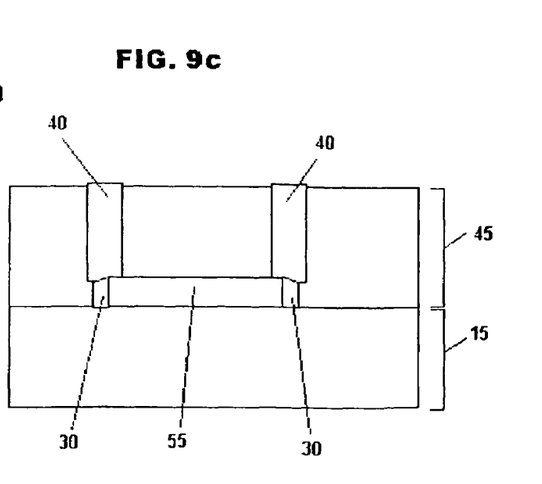
FIG. 9c is a schematic diagram of a semiconductor profile showing a second cross-sectional view of two memory cells including top electrodes resulting from the subsequent steps of a semiconductor process in accordance with the first illustrated embodiment of the present invention.

An etch is then performed to remove portions of the pad strip 50 to form pads 55 (FIG. 8a) and to remove portions of the phase change strips 33 to form the phase change elements 30. The etch is preferably selective to the pad strip 50 and the phase change strips 33, versus the bottom electrodes 10 to the extent exposed and the dielectric material used on the substrate 15. As presently embodied, all of the aforementioned portions are removed between neighboring memory cells as shown in FIGS. 8a and 8b. In FIG. 8b the pad 55 is shown comprising a rectangular shape with a top surface, a bottom surface, and four sidewalls disposed between the top and bottom surfaces. The pad 55 has length of about 10 μm and width of about 0.36 μm. From a review of FIGS. 8a and 8b, it can be discerned that the etch operates to determine the length 32 of each phase change element 30.

After the etch, the remaining portions of a superstratum 45 over the substrate 15 are disposed. The superstratum 45 is subsequently modified to form the top electrodes 40, wherein each top electrode 40 is disposed adjacent to a phase change element 30. The processes involved in forming the top electrodes 40 and following structures over the superstratum 45 can be incorporated by one skilled in the art from a conventional process flow formation of the first interlevel dielectric onward. Exemplary processes/recipes/dimensions for formation of the oxide, top electrodes 40, and metallization can include, for example, 0.18 μm W plug or Al line or Cu line. These processes can be performed to produce the structure shown in FIGS. 9a, 9b, and 9c.

Referring again to FIGS. 4a through 7b, and referring also to FIGS. 10 through 12c, a second illustrated embodiment of a method for fabricating phase change elements 30 of ultra small cross-sectional area is now described. After the bottom electrodes 10 are formed within the substrate 15 by any typical CMOS process, as shown in FIGS. 4a and 4b, a first material layer is deposited over the substrate 15. The first material layer can comprise polysilicon or a dielectric material, such as silicon dioxide, silicon nitride, or silicon oxynitride. Since the substrate 15 is a planar surface, i.e., there are no topographical features to fill within the substrate 15, the deposition of the first material layer can be accomplished via many conventional processes. The polysilicon can be formed, for example, by silane-based chemical vapor deposition. The dielectric material can be formed, for example, by silane-based chemical vapor deposition or by TEOS-based chemical vapor deposition. A preferred first material layer can comprise SiN with a thickness of about 500 Å. The first material layer is then etched to form a pad strip 50 and, as with the first illustrated embodiment, optionally to expose parts of the bottom electrodes 10. One such pad strip 50 can be viewed from the side in FIG. 5a and from the top in FIG. 5b. From the view of the pad strip 50 in FIG. 5b, it can be seen that the pad strip 50 is adjacent to the bottom electrodes 10. The etch can comprise a conventional photolithographic dielectric etch that is preferably selective to the pad strip 50 versus whichever dielectric material is present in the substrate 15. A conventional dry etch process can provide a SiN/SiO2 etching ratio at about 5:1. The pad strip 50 can have a length of about 10 μm and a width of about 0.36 μm. Once the pad strip 50 is formed, the phase change layer 35 is deposited over the pad strip 50 and the substrate 15. The phase change layer 35 as presently embodied comprises a chalcogenide material, which may be formed in a manner as described above relatively uniformly over the pad strip 50, over the substrate 15, and along the sides of the pad strip 50 as shown is FIG. 6. In modified embodiments, as with the first illustrated embodiment, the chalcogenide material may be formed non-uniformly over, or relative to, the pad strip 50, the substrate 15, and/or the sides of the pad strip 50.

Figure 5A:
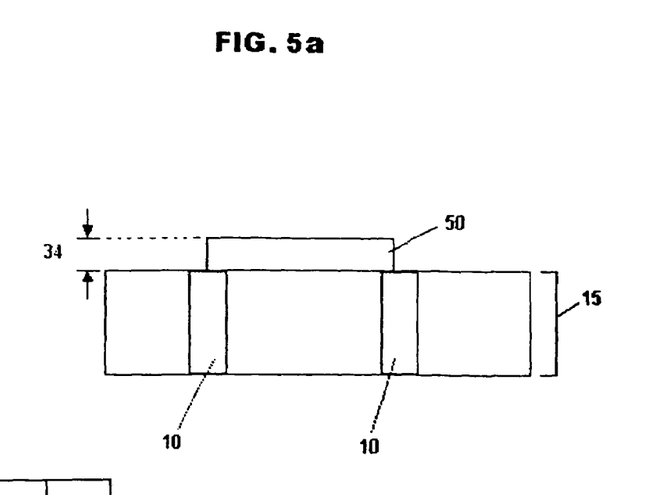
FIG. 5a is a schematic diagram of a semiconductor profile showing a cross-sectional view of a pad deposited over the bottom electrodes that results from a second step of a semiconductor process in accordance with the first and second illustrated embodiments of the present invention.
Figure 5B:
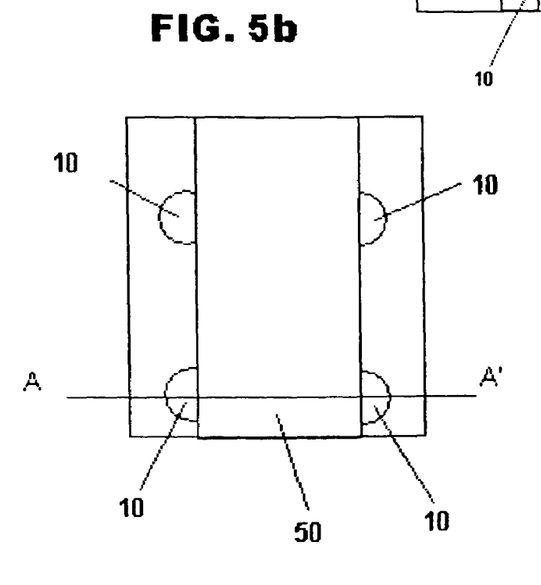
FIG. 5b is a schematic diagram of a semiconductor profile showing a plan view of a pad strip deposited over the bottom electrodes that results from the second step of a semiconductor process in accordance with the first and second illustrated embodiments of the present invention.

An etch back process can then be performed to modify the phase change layer 35 by removing a portion of the phase change layer 35 that is on top of the pad strip 50 and by removing another portion of the phase change layer 35 that is on top of the substrate 15, thus forming phase change strips 33 adjacent to both the sides of the pad strip 50 and the bottom electrodes 10 as shown in FIGS. 7a and 7b. A preferred etch back process involves chlorine with an endpoint and overetch that is determined by an optical or loading detector. The thicknesses of the pad strip 50 and the phase change strips 33, and the etch back process, can affect the height 34 of the phase change element 30; and sidewall coverage of the phase change layer 35 and the etch back process can affect the width 36 of the phase change element 30. FIGS. 3, 5*a* and 7 illustrate exemplary heights 34 and widths 36 of the phase change element 30.

A first etch is then performed to remove portions of the phase change strips 33 to form the phase change elements 30. The portions are removed between neighboring memory cells as shown in FIG. 10. The first etch is preferably selective to the phase change elements 30, versus the bottom electrodes 10 (to the extent exposed) and, pad strip 50, and the dielectric material used on the substrate 15. As with the first described embodiment, this first etch determines the length 32 of each phase change element 30.

Figure 11A:
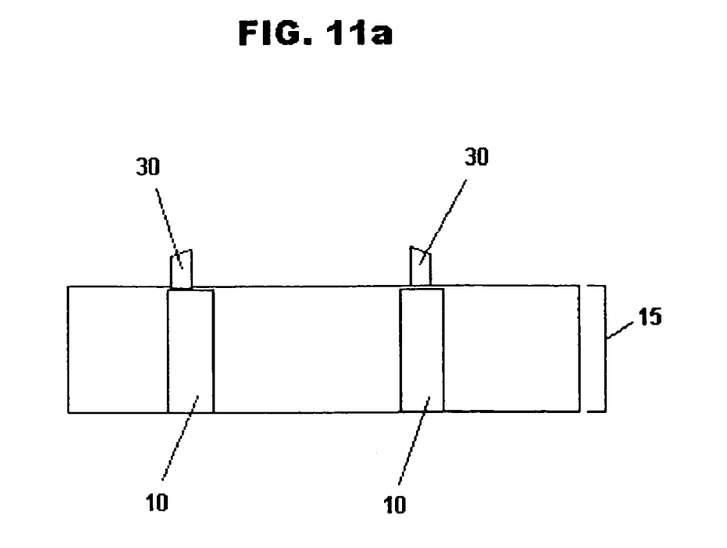
FIG. 11a is a schematic diagram of a semiconductor profile showing a cross-sectional view of phase change element without the pad after a sixth step of a semiconductor process in accordance with the second illustrated embodiment of the present invention.
Figure 11B:
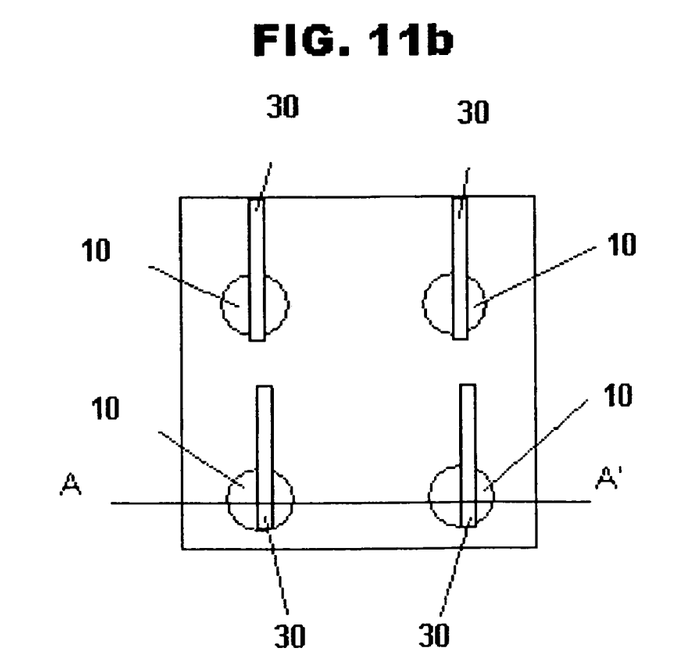
FIG. 11b is a schematic diagram of a semiconductor profile showing a plan view of phase change elements without the pad after the sixth step of a semiconductor process in accordance with the second illustrated embodiment of the present invention.
Figure 12A:
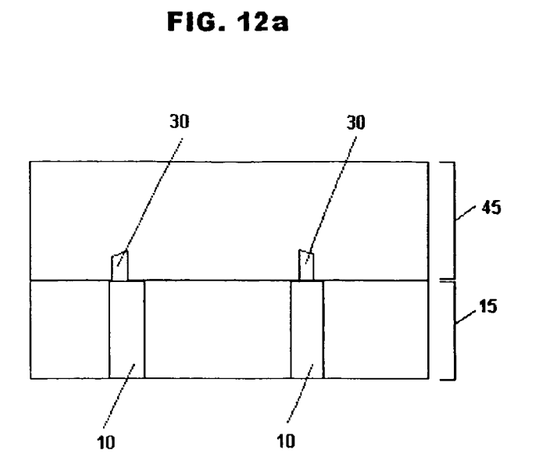
FIG. 12a is a schematic diagram of a semiconductor profile showing a first cross-sectional view of two memory cells including the bottom electrodes resulting from subsequent steps of a semiconductor process in accordance with the second illustrated embodiment of the present invention.
Figure 12B:
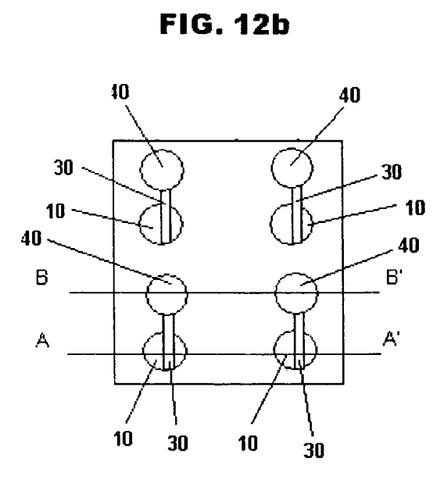
FIG. 12b is a schematic diagram of a semiconductor profile showing a plan view, with top oxide not shown for clarity, of two memory cells resulting from the subsequent steps of a semiconductor process in accordance with the second illustrated embodiment of the present invention.
Figure 12C:
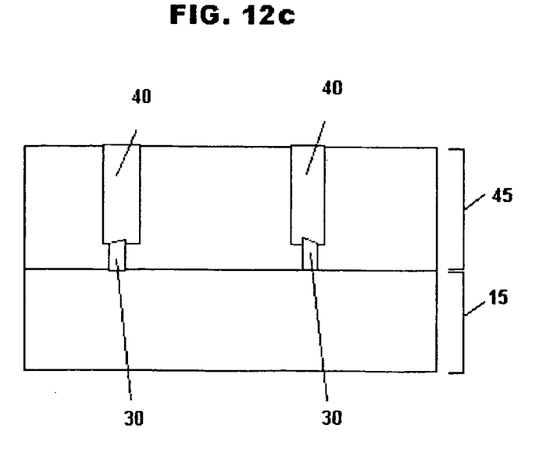
FIG. 12c is a schematic diagram of a semiconductor profile showing a second cross-sectional view of two memory cells including top electrodes resulting from the subsequent steps of a semiconductor process in accordance with the second illustrated embodiment of the present invention.

In addition to the first etch, a second etch is performed to remove the pad strip 50 as shown in FIGS. 11*a* and 11*b*. The second etch is preferably selective to the pad strip 50, versus the phase change elements 30, the bottom electrodes 10 (to the extent exposed), and the dielectric material on the substrate 15. Although the first etch is illustrated and described as being conducted before the second etch, in modified embodiments the second etch may be implemented before the first etch. Other modifications may also be possible, wherein for example, as a result of chosen selectivities, the initial etch, e.g., the first or second etch, may perform at least partially the function of the subsequent etch, e.g., the second or the first etch.

Following the second etch, the resulting superstratum 45 is modified to form the top electrodes 40, wherein each top electrode 40 is disposed adjacent to a phase change element 30. The above-referenced processes for forming the top electrodes 40 and additional structures over the superstratum 45 can be implemented, to thereby produce the structure shown in FIGS. 12*a*, 12*b*, and 12*c*.

In view of the foregoing, it will be understood by those skilled in the art that the methods of the present invention can facilitate the formation of contacts or vias, and in particular the formation of horizontal chalcogenide elements in non-volatile random access memory (NVRAM) devices.

The aforementioned embodiments have been provided by way of example, and the present invention is not limited to these examples. Multiple variations and modification to the disclosed embodiments will occur, to the extent not mutually exclusive to those skilled in the art upon consideration of the foregoing description. Additionally, other combinations, omissions, substitutions and modifications will be apparent to the skilled artisan in view of the disclosure herein. Accordingly, the present invention is not limited by the disclosed embodiments, but is to be defined by reference to the appended claims.

What is claimed is:

1. A memory cell structure, comprising:
   a substrate having a first bottom electrode at least partially disposed within the substrate;
   a pad disposed at least partially over the substrate, the pad comprising a top surface, a bottom surface, and at least two sidewalls disposed between the top and bottom surfaces;
   a first phase change element disposed at least partially over the substrate and adjacent to the pad, the first phase change element being formed on one of the at least two sidewalls of the pad and being operatively coupled to the first bottom electrode;
   a first top electrode operatively coupled to the first phase change element;
   a second phase change element formed on another one of the at least two sidewalls of the pad; and
   second top and bottom electrodes operatively coupled to the second phase change element.

2. The memory cell structure as set forth in claim 1, wherein the pad is disposed between the first phase change element and the second phase change element.

3. The memory cell structure as set forth in claim 1, wherein:
   the first bottom electrode is disposed within the substrate;
   the pad is disposed over and substantially parallel to a top surface of the substrate;
   the first phase change element is disposed over the substrate; and
   the first phase change element contacts both the first bottom electrode and the first top electrode.

4. The memory cell structure as set forth in claim 1, wherein the first phase change element has its longest dimension parallel to the substrate.

* * * * *